(12) United States Patent
Terao et al.

(10) Patent No.: US 11,764,800 B2
(45) Date of Patent: Sep. 19, 2023

(54) SWITCHED EMITTER FOLLOWER CIRCUIT

(71) Applicant: Nippon Telegraph and Telephone Corporation, Tokyo (JP)

(72) Inventors: Naoki Terao, Tokyo (JP); Munehiko Nagatani, Tokyo (JP); Hideyuki Nosaka, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 0 days.

(21) Appl. No.: 17/917,185

(22) PCT Filed: Apr. 9, 2020

(86) PCT No.: PCT/JP2020/015940
§ 371 (c)(1),
(2) Date: Oct. 5, 2022

(87) PCT Pub. No.: WO2021/205592
PCT Pub. Date: Oct. 14, 2021

(65) Prior Publication Data
US 2023/0141476 A1    May 11, 2023

(51) Int. Cl.
*H03M 1/12* (2006.01)
*H03K 17/296* (2006.01)
*H03K 17/62* (2006.01)
*G11C 27/02* (2006.01)

(52) U.S. Cl.
CPC ........ *H03M 1/1255* (2013.01); *H03K 17/296* (2013.01); *G11C 27/02* (2013.01); *H03K 17/6285* (2013.01); *H03M 1/124* (2013.01)

(58) Field of Classification Search
CPC .. H03M 1/1255; H03M 1/124; H03K 17/296; H03K 17/6285; G11C 27/02
See application file for complete search history.

(56) References Cited

U.S. PATENT DOCUMENTS

2023/0048012 A1*  2/2023  Terao .................... G11C 27/02

OTHER PUBLICATIONS

Yamanaka et al., "A 20-Gs/s Track- and-Hold Amplifier in InP HBT Technology," IEEE Transactions on Microwave Theory and Techniques, vol. 58, No. 9, Sep. 2010, pp. 2334-2339.

* cited by examiner

*Primary Examiner* — Joseph J Lauture
(74) *Attorney, Agent, or Firm* — Slater Matsil, LLP

(57) ABSTRACT

A switched emitter follower circuit is constituted by a transistor in which a base is connected to a signal input terminal, a power voltage is applied to a collector, and an emitter is connected to a signal output terminal, a capacitor in which one end is connected to the collector of the transistor, and the other end is connected to the emitter of the transistor, and a Gilbert-cell type multiplication circuit in which a positive-phase clock output terminal is connected to the emitter of the transistor, a negative-phase clock output terminal is connected to the base of the transistor, and a multiplication result of a differential clock signal and a differential clock signal input from an outside is output to the positive-phase clock output terminal and the negative-phase clock output terminal.

13 Claims, 11 Drawing Sheets

SWITCHED EMITTER FOLLOWER CIRCUIT

CROSS-REFERENCE TO RELATED APPLICATIONS

This application is a national phase entry of PCT Application No. PCT/JP2020/015940, filed on Apr. 9, 2020, which application is hereby incorporated herein by reference.

TECHNICAL FIELD

The present invention relates to a switched emitter follower circuit used for a track-and-hold circuit or the like which alternately repeats a track mode in which an output signal follows an input signal at timing synchronized with a clock signal and a hold mode in which the output signal is held constant.

BACKGROUND

An analog-to-digital converter (ADC) is a device widely used for communication, measurement and the like. The ADC converts an input voltage which is an analog signal at timing synchronized with a clock signal to a quantized digital value and outputs the digital code. The ADC includes a track-and-hold circuit in a front end portion in many cases (see NPL 1).

An operation of a track-and-hold circuit wo will be described by using FIGS. 8A to 8C. The simplest operation model of the track-and-hold circuit wo is constituted by an analog switch 103 and a capacitor 104. The analog switch 103 switches between two states, that is, between a track mode Mt which transmits an input to an output as it is in accordance with High/Low of a clock signal ck and a hold mode Mh in which the input and the output are electrically shut down. The capacitor 104 is used for holding a voltage of an output signal Vout which was shut down from the input in the hold mode at a constant value.

A relationship between the clock signal ck and the mode of the track-and-hold circuit 100 may be determined arbitrarily, but in the example in FIGS. 8A to 8C, an example in which the mode becomes the track mode Mt when the clock signal ck is High and becomes the hold mode Mh when the clock signal ck is Low will be described.

When the clock signal ck is High, that is, during the track mode Mt, as illustrated in FIG. 8B, the switch 103 is turned on, and the output signal Vout follows an input signal Vin. At a moment when the clock signal ck turns to Low from High (at the moment when the mode transfers from the track mode Mt to the hold mode Mh), the switch 103 is turned off as shown in FIG. 8C, and the voltage value of the input signal Vin at the moment is held in the capacitor 104 during the hold mode Mh. And at a moment when the clock signal ck becomes High again, the output signal Vout is reset and resumes following of the input signal Vin.

One of reasons why the track-and-hold circuit is used for the front end portion of the ADC is that, since the ADC needs a certain period of time for the analog-to-digital conversion, it is necessary to hold the input signal during the conversion.

Another reason why the track-and-hold circuit is used for the front end portion of the ADC is to reduce an influence of a noise by a clock jitter. Since the timing of the clock signal is not perfectly equal interval, statistical variation is generated in the timing for holding the input signal. If there is a clock jitter as above, such observation is made that the noise is superposed on the output of the ADC.

By using the track-and-hold circuit with extremely few clock jitters for the front end portion, even if the clock jitter occurs to some degree in the ADC in a rear stage, there is no influence of the noise as long as the clock jitter is contained in the hold time of the track-and-hold circuit.

Particularly in the recent most advanced ADC, since it is difficult to lower the clock jitter, a higher speed cannot be realized while a noise level is suppressed in a practical range, which causes the clock jitter to become a factor that hinders the higher speed. Thus, realization of the higher speed of the track-and-hold circuit is effective for the higher speed of the ADC.

In many cases, an analog circuit is constituted by connecting a switching element also called a transistor, a resistor, a capacitor, and the like. There are several types of the transistors, but a bipolar transistor is often used in the analog circuit which requires a high-speed operation. As a circuit configuration of the existing track-and-hold circuit using the bipolar transistor, the one called a switched emitter follower circuit is known.

A typical configuration of the conventional switched emitter follower circuit using the bipolar transistor is illustrated in FIG. 9. VCC and VEE in FIG. 9 are power voltages, Vin is an input signal, Vout is an output signal, and ck+ and ck− are clock signals. The clock signals ck+ and ck− are differential signals. Moreover, (const.) in FIG. 9 indicates that a voltage or an electric current is constant regardless of time.

The switched emitter follower circuit is constituted by bipolar transistors M1 to M3, a capacitor Chold, and a constant current source IS. The constant current source IS is constituted by a transistor and the like in many cases. IEE1 and IEE2 are electric currents flowing through the constant current source IS from emitters of the bipolar transistors M2 and M3. Assuming that the electric current flowing through the constant current source IS is IEE, it is IEE1+IEE2=IEE in compliance with Kirchhoff's electric current law.

A basic operation of the switched emitter follower circuit in FIG. 9 will be described by using FIGS. 10A to 10E. Here, waveforms of the electric currents IEE1 and IEE2 are shown in FIGS. 10C and 10D, and the waveform of the output signal Vout is shown in FIG. 10E, when the differential clock signals ck+ and ck− in a period Tck shown in FIG. 10A and the input signal Vin shown in FIG. 10B are applied to the switched emitter follower circuit. t0, t1, t2, t3, and t4 in FIGS. 10A to 10E indicate time. t0 to t4 are aligned at each constant interval Tck/2.

When the clock signal is High, that is, when it is ck+>ck− (time t satisfies t0≤t≤t1 or t2≤t≤t3), the transistor M2 is turned OFF, and the transistor M3 is turned ON and thus, it is IEE1=IEE, IEE2=0. At this time, since base-emitter PN junction of the transistor M1 is brought into an ON state, an emitter voltage (output signal Vout) of the transistor M1 follows the input signal Vin. That is, when the time t satisfies t0≤t≤t1 or t2≤t≤t3, the switched emitter follower circuit is in the track mode.

On the other hand, when the clock signal is Low, that is, when it is ck+<ck− (time t satisfies t1≤t≤t2 or t3≤t≤t4), the transistor M2 is turned ON, and the transistor M3 is turned OFF and thus, it is IEE1=0, IEE2=IEE. Therefore, the electric current does not flow through the transistor M1, and the base-emitter PN junction of the transistor M1 is brought into the OFF state and thus, the base and the emitter of the transistor M1 are electrically separated. At this time, since the emitter voltage (the output signal Vout) of the transistor M1 at the moment when the clock signal becomes Low from High is held by the capacitor Chold, the output signal Vout is held at a constant value only while the clock signal is Low. That is, when the time t satisfies t1≤t≤t2 or t3≤t≤t4, the switched emitter follower circuit is in the hold mode.

As described above, alternate repetition of the track mode and the hold mode in accordance with High/Low of the clock signal is the basic operation of the switched emitter follower circuit.

A data rate of the switched emitter follower circuit, that is, the number of times of acquiring data per unit time obviously depends on a clock frequency. However, the frequency of the clock signal that can be input has an upper limit due to restriction conditions of an analog circuit or more specifically, parasitic resistance, parasitic capacitance and the like present in a transistor or wiring. This upper limit on the frequency of the clock signal is a main factor which limits a speed of the switched emitter follower circuit.

CITATION LIST

Non Patent Literature

[NPL 1] S. Yamanaka, K. Sano, K. Murata, "A 20-Gs/s Track-and-Hold Amplifier in InP HBT Technology", in IEEE Transactions on Microwave Theory and Techniques, vol. 58, No. 9, pp. 2334-2339, September 2010.

SUMMARY

Technical Problem

Embodiments of the present invention was made in order to solve the above problem and has an object to provide a switched emitter follower circuit which can operate at a sampling frequency which is twice of a clock frequency.

Means for Solving the Problem

The switched emitter follower circuit of embodiments of the present invention comprises a first transistor in which a base is connected to a signal input terminal, a first power voltage is applied to a collector, and an emitter is connected to a signal output terminal; a capacitor in which one end is connected to the collector of the first transistor, and the other end is connected to the emitter of the first transistor; and a Gilbert-cell type multiplication circuit in which a positive-phase clock output terminal is connected to the emitter of the first transistor, and a negative-phase clock output terminal is connected to the base of the first transistor, the Gilbert-cell type multiplication circuit configured to output a multiplication result of a first differential clock signal and a second differential clock signal input from an outside to the positive-phase clock output terminal and the negative-phase clock output terminal.

Moreover, the switched emitter follower circuit of embodiments of the present invention comprises a first transistor in which a base is connected to a positive-phase signal input terminal, a first power voltage is applied to a collector, and an emitter is connected to a positive-phase signal output terminal; a second transistor in which a base is connected to a negative-phase signal input terminal, the first power voltage is applied to a collector, and an emitter is connected to a negative-phase signal output terminal; a first capacitor in which one end is connected to the collector of the first transistor and the other end is connected to the emitter of the first transistor; a second capacitor in which one end is connected to the collector of the second transistor and the other end is connected to the emitter of the second transistor; a first Gilbert-cell type multiplication circuit in which a first positive-phase clock output terminal is connected to the emitter of the first transistor, and a first negative-phase clock output terminal is connected to the base of the first transistor, the first Gilbert-cell type multiplication circuit configured to output a multiplication result of a first differential clock signal and a second differential clock signal input from an outside to the first positive-phase clock output terminal and the first negative-phase clock output terminal; and a second Gilbert-cell type multiplication circuit in which a second positive-phase clock output terminal is connected to the emitter of the second transistor, and a second negative-phase clock output terminal is connected to the base of the second transistor, the second Gilbert-cell type multiplication circuit configured to output a multiplication result of the first differential clock signal and the second differential clock signal to the second positive-phase clock output terminal and the second negative-phase clock output terminal.

Effects of Embodiments of the Invention

According to embodiments of the present invention, by providing the first and second transistors, the first and second capacitors, and the first and second Gilbert-cell type multiplication circuits, a sampling frequency of the switched emitter follower circuit can be raised to twice of a clock frequency while the clock frequency remains as conventional. Therefore, according to embodiments of the present invention, a higher speed of the switched emitter follower circuit can be realized while restriction on an analog circuit remains as conventional.

Moreover, in embodiments of the present invention, by providing the first and second transistors, the first and second capacitors, and the first and second Gilbert-cell type multiplication circuits, the sampling frequency of the switched emitter follower circuit can be raised to twice of the clock frequency while the clock frequency remains as conventional. Moreover, in embodiments of the present invention, by having differential constitutions of the first and second transistors for input, resistance of the switched emitter follower circuit against a same-phase noise of the input signal can be reinforced.

DETAILED DESCRIPTION OF ILLUSTRATIVE EMBODIMENTS

First Embodiment

Figure 1:
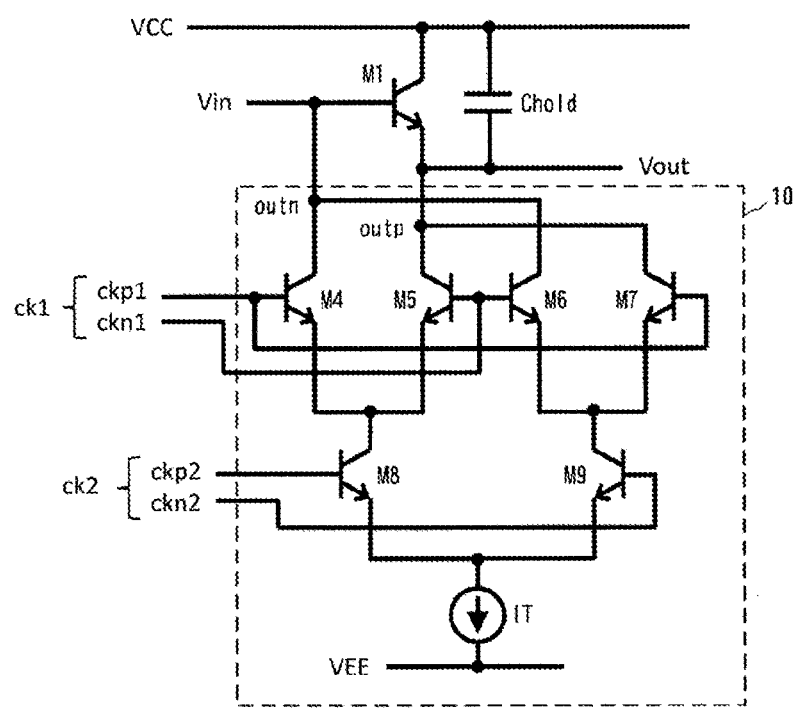
FIG. 1 is a circuit diagram illustrating a constitution of a switched emitter follower circuit according to a first embodiment of the present invention.

Hereinafter, embodiments of the present invention will be described by referring to figures. FIG. 1 is a circuit diagram illustrating a constitution of a switched emitter follower circuit according to a first embodiment of the present invention. The switched emitter follower circuit of this embodiment is constituted by an NPN bipolar transistor M1 in which a base is connected to a signal input terminal (Vin), a power voltage VCC is applied to a collector, and an emitter is connected to a signal output terminal (Vout), a capacitor Chold in which one end is connected to the collector of the transistor M1, and the other end is connected to the emitter of the transistor M1, and a Gilbert-cell type multiplication circuit 10 in which a positive-phase clock output terminal (outp) is connected to the emitter of the transistor M1, a negative-phase clock output terminal (outn) is connected to the base of the transistor M1, and a multiplication result of a differential clock signal ck1 and a differential clock signal ck2 input from an outside is output to the positive-phase clock output terminal and the negative-phase clock output terminal.

The Gilbert-cell type multiplication circuit 10 is constituted by an NPN bipolar transistor M4 in which a positive-phase signal ckp1 of the differential clock signal ck1 is input into a base, and a collector is connected to the negative-phase clock output terminal (outn), an NPN bipolar transistor M5 in which a negative-phase signal ckn1 of the differential clock signal ck1 is input into the base, and the collector is connected to the positive-phase clock output terminal (outp), an NPN bipolar transistor M6 in which the negative-phase signal ckn1 of the differential clock signal ck1 is input into the base, and the collector is connected to the negative-phase clock output terminal (outn), an NPN bipolar transistor M7 in which the positive-phase signal ckp1 of the differential clock signal ck1 is input into the base, and the collector is connected to the positive-phase clock output terminal (outp), an NPN bipolar transistor M8 in which a positive-phase signal ckp2 of the differential clock signal ck2 is input into the base, and the collector is connected to the emitters of the transistors M4 and M5, an NPN bipolar transistor M9 in which a negative-phase signal ckn2 of the differential clock signal ck2 is input into the base, and the collector is connected to the emitters of the transistors M6 and M7, and a constant current source IT in which one end is connected to the emitters of the transistors M8 and M9, while a power voltage VEE is applied to the other end and which supplies a constant electric-current to the transistors M8 and M9.

The transistors M4 and M5 constitute an upper differential pair with the positive-phase signal ckp1 and the negative-phase signal ckn1 of the differential clock signal ck1 as inputs. Similarly, the transistors M6 and M7 constitute the upper differential pair. The transistors M8 and M9 have the positive-phase signal ckp2 and the negative-phase signal ckn2 of the differential clock signal ck2 as inputs and supply a tail electric current to the upper differential pair constituted by the transistors M4 and M5 and the upper differential pair constituted by the transistors M6 and M7.

And the positive-phase signal outp of the multiplication result of the differential clock signals ck1 and ck2 is output from the collectors (positive-phase clock output terminals) of the transistors M5 and M7, and the negative-phase signal outn of the multiplication result of the differential clock signals ck1 and ck2 is output from the collectors (negative-phase clock output terminals) of the transistors M4 and M6.

Figure 2:
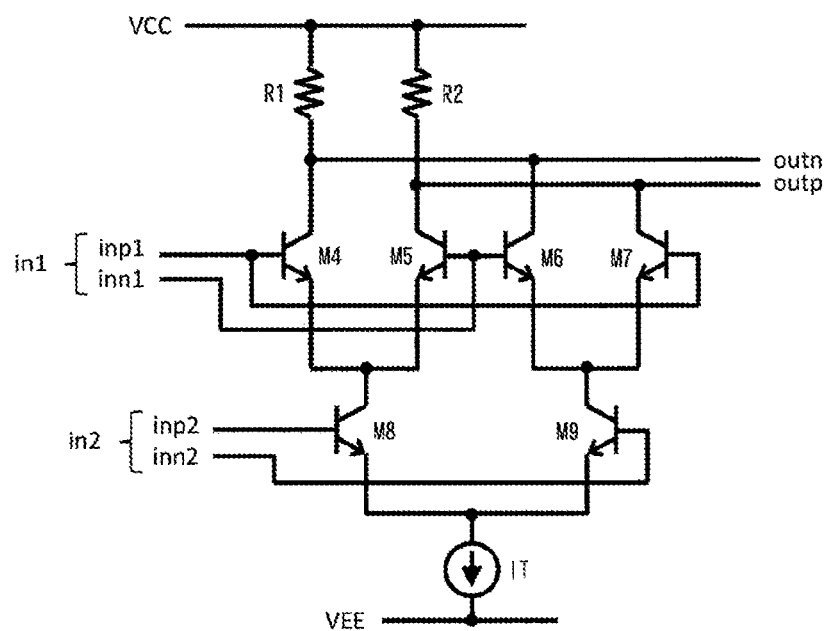
FIG. 2 is a circuit diagram illustrating a typical constitution of a Gilbert-cell type multiplication circuit.

Note that a typical constitution of the Gilbert-cell type multiplication circuit is illustrated in FIG. 2. In the constitution in FIG. 2, a load resistance R1 is connected to the negative-phase clock output terminal, a load resistance R2 is connected to the positive-phase clock output terminal, and inputs are differential signals in1 and in2, but an operation of the circuit is the same as that of the Gilbert-cell type multiplication circuit 10 in FIG. 1.

The Gilbert-cell type multiplication circuit as above is disclosed in the document "B. Gilbert, "A Precise Four-Quadrant Multiplier with Subnanosecond Response", IEEE J. Solid-State Circuits, vol. SC-3, pp. 365-373, 1968", for example.

In the constitution in FIG. 1, frequencies of the differential clock signals ck1 and ck2 are the same. Moreover, in the constitution in FIG. 1, the positive-phase signal ckp1 of the differential clock signal ck1 is input into the transistors M4 and M7, and the negative-phase signal ckn1 is input into the transistors M5 and M6, but the inputs of the positive-phase signal ckp1 and the negative-phase signal ckn1 may be opposite. Similarly, the positive-phase signal ckp2 of the differential clock signal ck2 is input into the transistor M8, and the negative-phase signal ckn2 is input into the transistor M9, but the inputs of the positive-phase signal ckp2 and the negative-phase signal ckn2 may be opposite.

Alternatively, either one of the positive-phase signal ckp1 and the negative-phase signal ckn1 may be a DC bias voltage. In this case, it is only necessary to input the clock signal in a single phase to either one of a pair of the transistors M4 and M7 and a pair of the transistors M5 and M6, and the DC bias voltage to the other pair.

Similarly, either one of the positive-phase signal ckp2 and the negative-phase signal ckn2 may be a DC bias voltage. In this case, it is only necessary to input the single-phase clock signal into either one of the transistors M8 and M9, and the DC bias voltage to the other.

Due to a nature of the Gilbert-cell type multiplication circuit 10, the differential clock signals ck1 and ck2 do not have to have the same phase, and there is no problem even if the differential clock signals ck1 and ck2 have a delay (phase difference).

The load current of the transistor M1 oscillates at a frequency of the multiplication result of the differential clock signals ck1 and ck2, that is, twice of the clock frequency. Therefore, the transistor M1 performs switching at the frequency twice of the clock frequency.

As described above, in this embodiment, the sampling frequency of the switched emitter follower circuit can be made twice of the clock frequency. Therefore, according to this embodiment, a higher speed of the switched emitter follower circuit can be realized.

Second Embodiment

Figure 3:
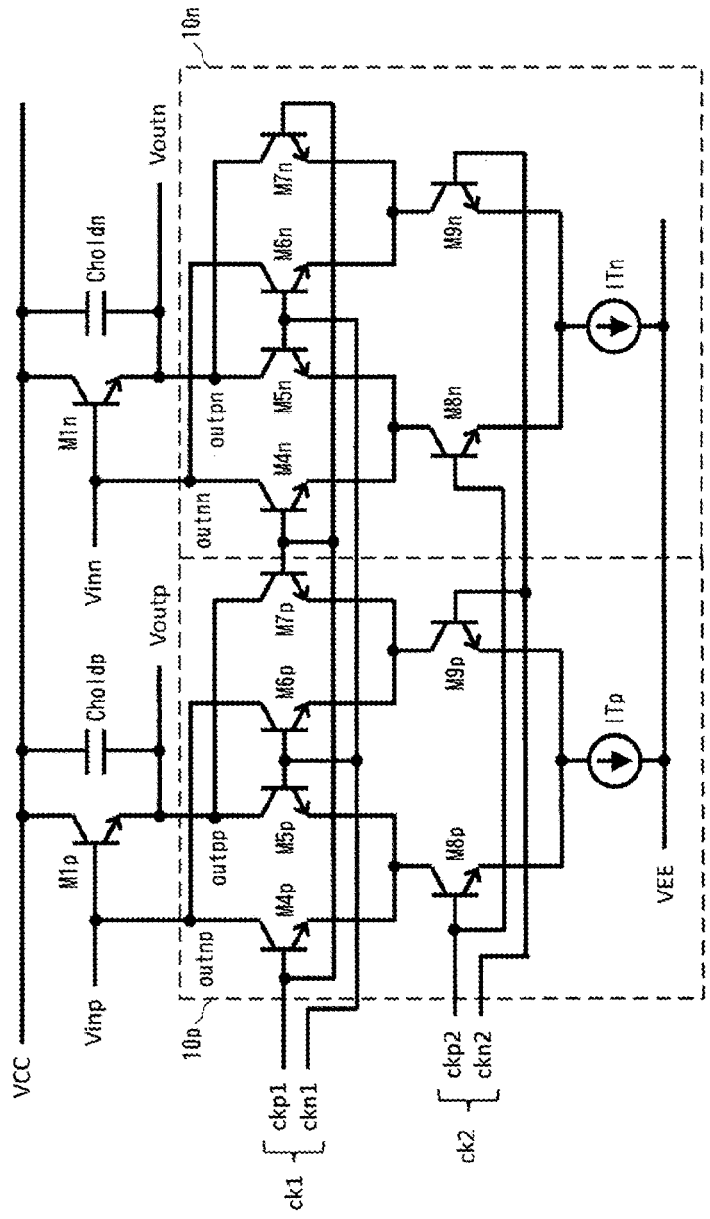
FIG. 3 is a circuit diagram illustrating a constitution of a switched emitter follower circuit according to a second embodiment of the present invention.

Subsequently, a second embodiment of the present invention will be described. FIG. 3 is a circuit diagram illustrating a constitution of a switched emitter follower circuit according to the second embodiment of the present invention. The switched emitter follower circuit of this embodiment is constituted by an NPN bipolar transistor M1p in which a base is connected to a positive-phase signal input terminal (Vinp), the power voltage VCC is applied to a collector, and an emitter is connected to a positive-phase signal output terminal (Voutp), an NPN bipolar transistor M1n in which the base is connected to a negative-phase signal input terminal (Vinn), the power voltage VCC is applied to the collector, and the emitter is connected to a negative-phase signal output terminal (Voutn), a capacitor Choldp in which one end is connected to the collector of the transistor M1p, and the other end is connected to the emitter of the transistor M1p, a capacitor Choldn in which one end is connected to the collector of the transistor M1n, and the other end is connected to the emitter of the transistor M1n, a Gilbert-cell type multiplication circuit 1op in which a first positive-phase clock output terminal (outpp) is connected to the emitter of the transistor M1p, a first negative-phase clock output terminal (outnp) is connected to the base of the transistor M1p, and a multiplication result of the differential clock signal ck1 and the differential clock signal ck2 is output to the first positive-phase clock output terminal and the first negative-phase clock output terminal, and a Gilbert-cell type multiplication circuit ion in which a second positive-phase clock output terminal (outpn) is connected to the emitter of the transistor M1n, a second negative-phase clock output terminal (outnn) is connected to the base of the transistor M1n, and the multiplication result of the differential clock signal ck1 and the differential clock signal ck2 is output to the second positive-phase clock output terminal and the second negative-phase clock output terminal.

The Gilbert-cell type multiplication circuit 10p is constituted by an NPN bipolar transistor M4p in which the positive-phase signal ckp1 of the differential clock signal ck1 is input into a base, and a collector is connected to a first negative-phase clock output terminal (outnp), an NPN bipolar transistor M5p in which a negative-phase signal ckn1 of the differential clock signal ck1 is input into the base, and the collector is connected to a first positive-phase clock output terminal (outpp), an NPN bipolar transistor M6p in which the negative-phase signal ckn1 of the differential clock signal ck1 is input into the base, and the collector is connected to the first negative-phase clock output terminal (outnp), an NPN bipolar transistor M7p in which the positive-phase signal ckp1 of the differential clock signal ck1 is input into the base, and the collector is connected to the first positive-phase clock output terminal (outpp), an NPN bipolar transistor M8p in which a positive-phase signal ckp2 of the differential clock signal ck2 is input into the base, and the collector is connected to the emitters of the transistors M4p and M5p, an NPN bipolar transistor M9p in which a negative-phase signal ckn2 of the differential clock signal ck2 is input into the base, and the collector is connected to the emitters of the transistors M6p and M7p, and a constant current source ITp in which one end is connected to the emitters of the transistors M8p and M9p, while the power voltage VEE is applied to the other end and which supplies a constant electric-current to the transistors M8p and M9p.

The Gilbert-cell type multiplication circuit ion is constituted by an NPN bipolar transistor M4n in which the positive-phase signal ckp1 of the differential clock signal ck1 is input into a base, and a collector is connected to a second negative-phase clock output terminal (outnn), an NPN bipolar transistor M5n in which the negative-phase signal ckn1 of the differential clock signal ck1 is input into the base, and the collector is connected to a second positive-phase clock output terminal (outpn), an NPN bipolar transistor M6n in which the negative-phase signal ckn1 of the differential clock signal ck1 is input into the base, and the collector is connected to the second negative-phase clock output terminal (outnn), an NPN bipolar transistor M7n in which the positive-phase signal ckp1 of the differential clock signal ck1 is input into the base, and the collector is connected to the second positive-phase clock output terminal (outpn), an NPN bipolar transistor M8n in which a positive-phase signal ckp2 of the differential clock signal ck2 is input into the base, and the collector is connected to the emitters of the transistors M4n and M5n, an NPN bipolar transistor M9n in which a negative-phase signal ckn2 of the differential clock signal ck2 is input into the base, and the collector is connected to the emitters of the transistors M6n and M7n, and a constant current source ITn in which one end is connected to the emitters of the transistors M8n and M9n, while the power voltage VEE is applied to the other end and which supplies a constant electric-current to the transistors M8n and M9n.

Operations of the Gilbert-cell type multiplication circuits 10p and 10n are the same as that of the Gilbert-cell type multiplication circuit 10 in the first embodiment. The positive-phase signal outpp of the multiplication result of the differential clock signals ck1 and ck2 is output from the collectors (the first positive-phase clock output terminals) of the transistors M5p and M7p of the Gilbert-cell type multiplication circuit 10p, and the negative-phase signal outnp of the multiplication result of the differential clock signals ck1 and ck2 is output from the collectors (the first negative-phase clock output terminals) of the transistors M4p and M6p. Similarly, the positive-phase signal outpn of the multiplication result of the differential clock signals ck1 and ck2 is output from the collectors (the second positive-phase clock output terminals) of the transistors M5n and M7n of the Gilbert-cell type multiplication circuit ion, and the negative-phase signal outnn of the multiplication result of the differential clock signals ck1 and ck2 is output from the collectors (the second negative-phase clock output terminals) of the transistors M4n and M6n.

In this embodiment, the input signal has the differential constitution (Vinp, Vinn), and the transistors for input has the differential constitutions of M1p and M1n in accordance with that and thus, resistance of the switched emitter follower circuit against the same-phase noise of the input signal can be reinforced. A voltage difference of the positive-phase signal Vinp and the negative-phase signal Vinn of the differential input signal is Vin=Vinp−Vinn. The voltage difference of the positive-phase signal Voutp and the negative-phase signal Voutn of the differential output signal is Vout=Voutp−Voutn. That is, since information is given to a difference in the signal, the same positive-phase noise is cancelled by calculating a difference between the positive-phase signal Voutp and the negative-phase signal Voutn of the differential output signal.

In order to confirm that the circuit of this embodiment is actually operated, simple verification was conducted by using a circuit simulation software LTspice (Registered Trademark) XVII by Analog Devices Inc. In this circuit simulation, the positive-phase signal Vinp and the negative-phase signal Vinn of the differential input signal was set to a sine wave with a frequency of 200 Hz and an amplitude of 100 mV. Moreover, the positive-phase signal ckp1 and the negative-phase signal ckn1 of the differential clock signal ck1 was set to a sine wave with a frequency of 1 kHz and an amplitude of 100 mV. As the differential clock signal ck2, the same signal as the differential clock signal ck1 was used. Moreover, capacities of the capacitors Choldp and Choldn were set to 500 nF, and the electric current flowing through the constant current sources ITp and ITn was set to 1 mA.

Figure 4:
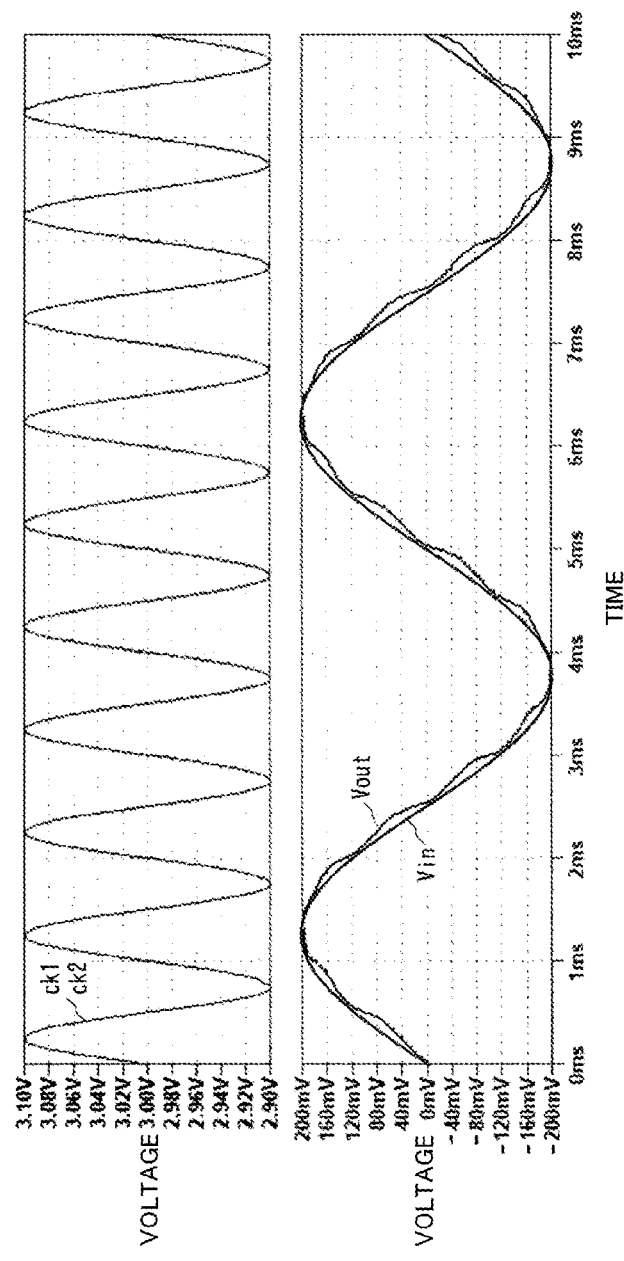
FIG. 4 is a waveform diagram illustrating a simulation result of the switched emitter follower circuit according to the second embodiment of the present invention.

A simulation result of responses of the switched emitter follower circuit in FIG. 3 for time of 10 ms is illustrated in FIG. 4. According to FIG. 4, it is known that the sampling is performed at 2 kHz, which is twice of the clock frequency 1 kHz as expected.

Third Embodiment

Figure 5:
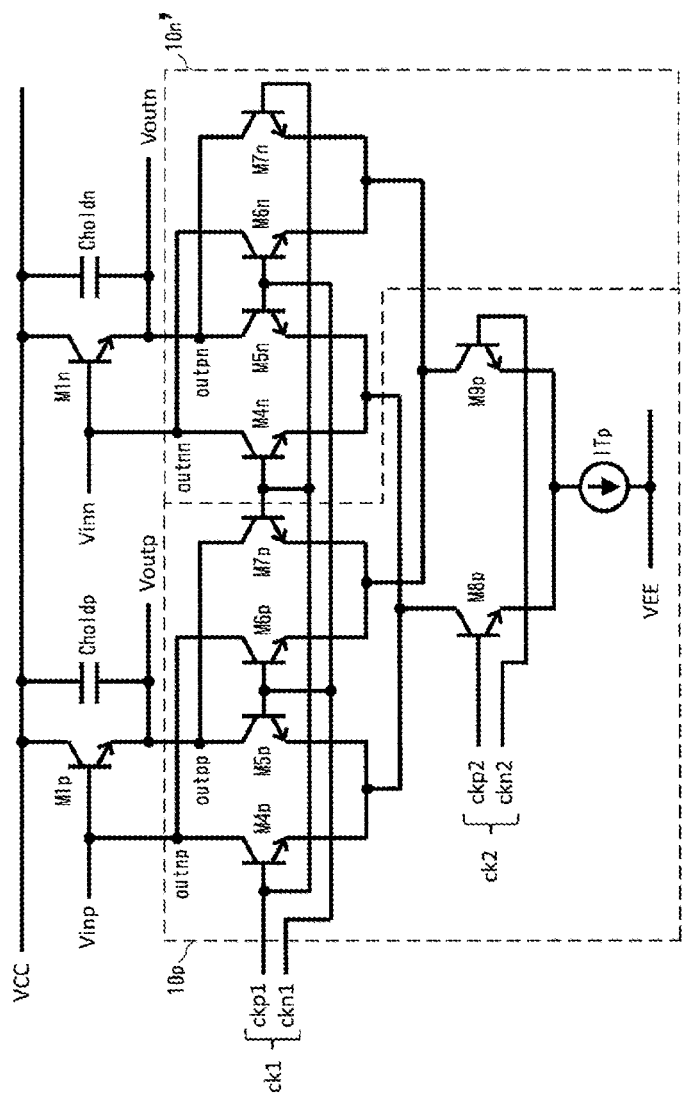
FIG. 5 is a circuit diagram illustrating a constitution of a switched emitter follower circuit according to a third embodiment of the present invention.

Subsequently, a third embodiment of the present invention will be described. FIG. 5 is a circuit diagram illustrating a constitution of a switched emitter follower circuit according to the third embodiment of the present invention. The switched emitter follower circuit of this embodiment is constituted by the NPN bipolar transistors M1p and M1n, the capacitors Choldp and Choldn, and the Gilbert-cell type multiplication circuits 10p and 10n'.

The second embodiment has a structure in which two units of Gilbert-cell type multiplication circuits 10p and 10n, which are the same type as the Gilbert-cell type multiplication circuit 10 in the first embodiment, are provided. Since a lower movable pair (M8p, M9p) of the Gilbert-cell type multiplication circuit 1op and a lower movable pair (M8n, M9n) of the Gilbert-cell type multiplication circuit ion perform the totally same operations, the number of transistors to be used can be decreased by grouping them into one.

In this embodiment, too, the constitution of the Gilbert-cell type multiplication circuit 1op is the same as that of the second embodiment. The constitutions of an upper differential pair constituted by the transistors M4n and M5n and the upper differential pair constituted by the transistors M6n and M7n of the Gilbert-cell type multiplication circuit 10n' are the same as that of the Gilbert-cell type multiplication circuit 10n.

The Gilbert-cell type multiplication circuit 10n' is constituted to share an electric-current source circuit with the Gilbert-cell type multiplication circuit 10p. Specifically, the emitters of the transistors M4n and M5n of the Gilbert-cell type multiplication circuit 10n' are connected to the collector of the transistor M8p, and the emitters of the transistors M6n and M7n are connected to the collector of the transistor M9p.

As described above, in this embodiment, since the number of transistors can be decreased more than the second embodiment, a circuit scale can be made smaller, and power consumption can be reduced.

Fourth Embodiment

Figure 6:
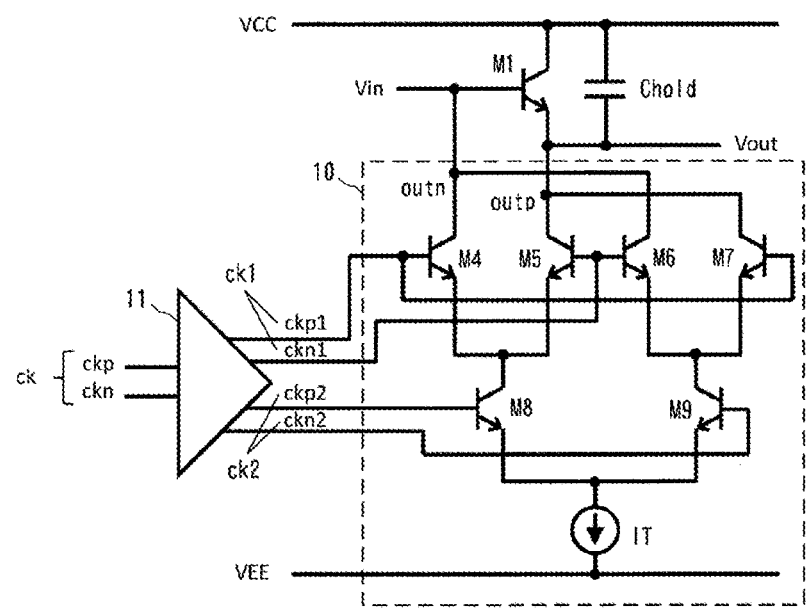
FIG. 6 is a circuit diagram illustrating a constitution of a switched emitter follower circuit according to a fourth embodiment of the present invention.

Subsequently, a fourth embodiment of the present invention will be described. FIG. 6 is a circuit diagram illustrating a constitution of a switched emitter follower circuit according to the fourth embodiment of the present invention. The switched emitter follower circuit of this embodiment is constituted by the NPN bipolar transistor M1, the capacitor Chold, the Gilbert-cell type multiplication circuit 10, and a clock distribution circuit 11 which branches the differential clock signal ck into the differential clock signal ck1 and the differential clock signal ck2.

In the first to third embodiments, the two differential clock signals ck1 and ck2 are supposed to be input into the switched emitter follower circuit from the outside.

On the other hand, in this embodiment, the differential clock signals ck1 and ck2 are generated by branching the differential clock signal ck by the clock distribution circuit 11. As a result, in this embodiment, the number of the differential clock signal to be applied from the outside can be made to be one.

Figure 7:
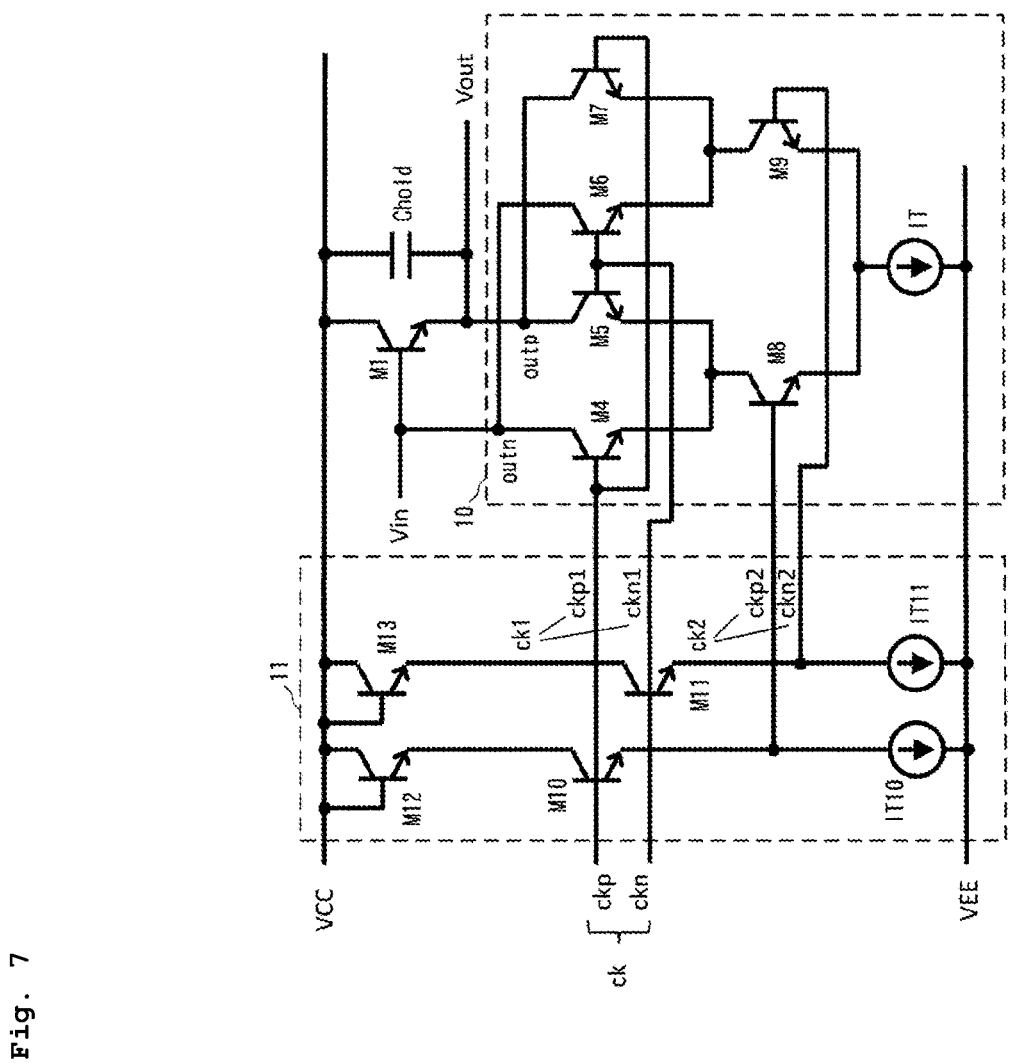
FIG. 7 is a circuit diagram illustrating an example of a clock distribution circuit of the switched emitter follower circuit according to the fourth embodiment of the present invention.
Figure 8A:
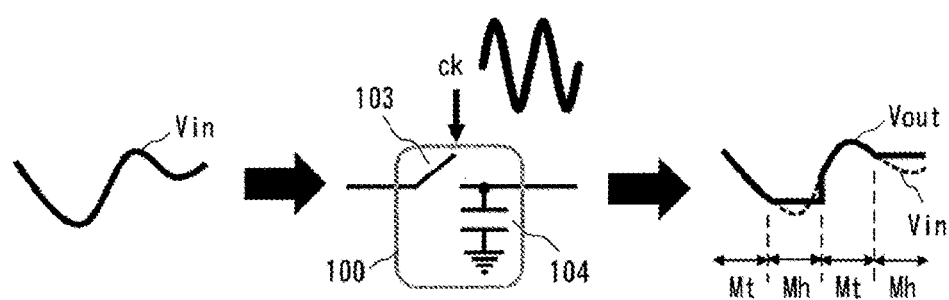
FIGS. 8A to 8C are diagrams for explaining an operation of a track-and-hold circuit.
Figure 8B:
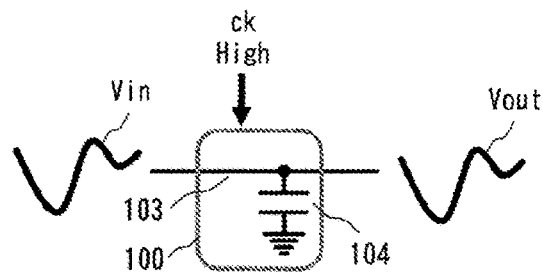
Figure 8C:
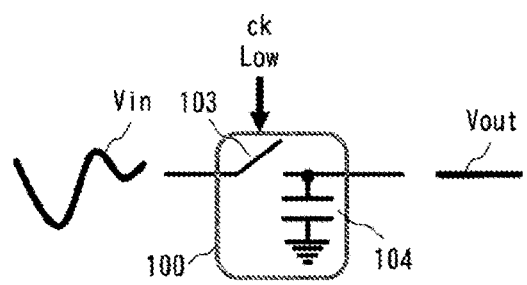
Figure 9:
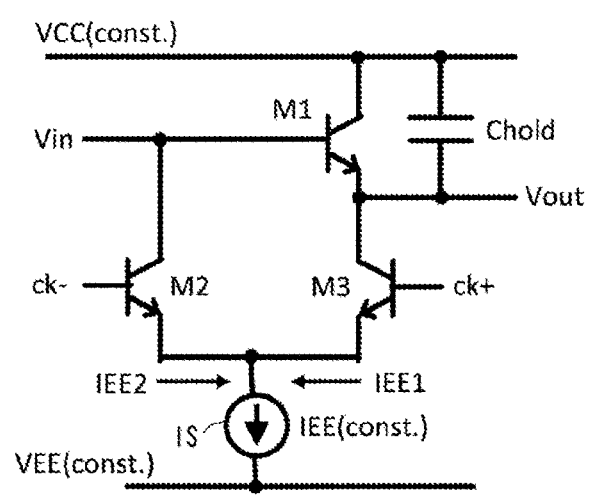
FIG. 9 is a circuit diagram illustrating a constitution of a conventional switched emitter follower circuit.
Figure 10A:
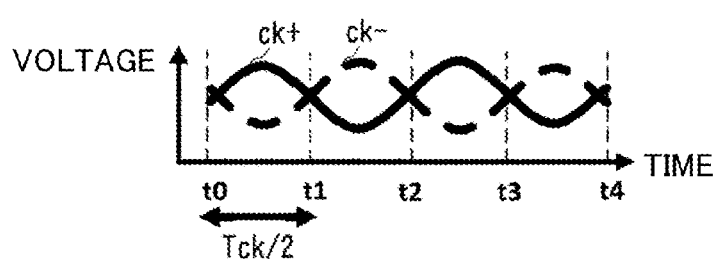
FIGS. 10A to 10E are diagrams illustrating signal waveforms of each portion of the conventional switched emitter follower circuit.
Figure 10B:
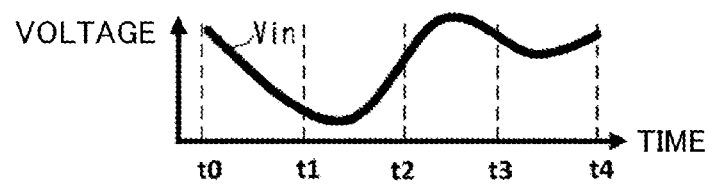
Figure 10C:
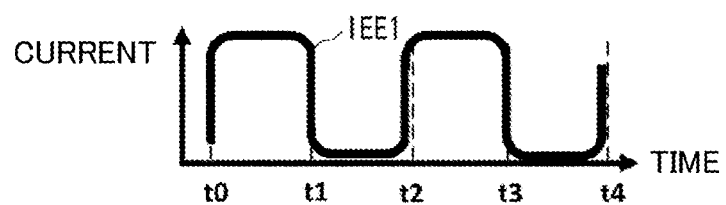
Figure 10D:
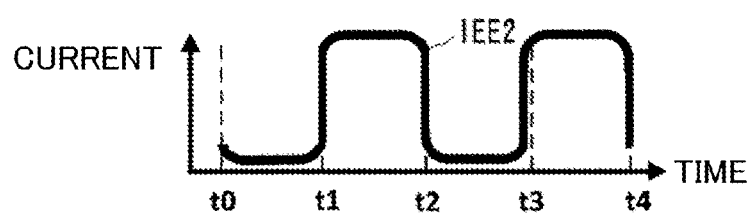
Figure 10E:
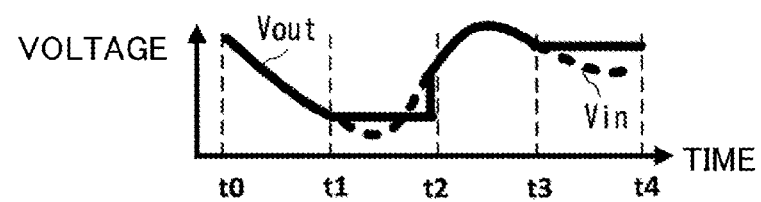

One example of a specific constitution of the clock distribution circuit 11 is illustrated in FIG. 7. The clock distribution circuit 11 is constituted by an NPN bipolar transistor M10 in which the positive-phase signal ckp of the differential clock signal ck is input into the base, an NPN bipolar transistor M11 in which the negative-phase signal ckn of the differential clock signal ck is input into the base, an NPN bipolar transistor M12 in which the power voltage VCC is applied to the base and the collector, and the emitter is connected to the collector of the transistor M10, an NPN bipolar transistor M13 in which the power voltage VCC is applied to the base and the collector, and the emitter is connected to the collector of the transistor M11, a constant current source IT10 in which one end is connected to the emitter of the transistor M10, and the power voltage VEE is applied to the other end, and a constant current source IT11 in which one end is connected to the emitter of the transistor M11, and the power voltage VEE is applied to the other end.

The constitution of FIG. 7 uses the emitter follower circuit. The differential clock signal ck is output as it is as the differential clock signal ck1. Moreover, a signal obtained by shifting the bias voltage of the positive-phase signal ckp of the differential clock signal ck only by a base-emitter voltage of the transistor M10 is output as the positive-phase signal ckp2 of the differential clock signal ck2 from the emitter of the transistor M10. Furthermore, a signal obtained by shifting the bias voltage of the negative-phase signal ckn of the differential clock signal ck only by the base-emitter voltage of the transistor M11 is output as the negative-phase signal ckn2 of the differential clock signal ck2 from the emitter of the transistor M11.

It is needless to say that the constitution of the clock distribution circuit 11 is not limited to FIG. 7, and other constitutions may be used.

Moreover, in the examples in FIGS. 6 and 7, explanation was made by citing the example in which the clock distribution circuit 11 is applied to the first embodiment, but it is needless to say that the clock distribution circuit 11 may be applied to the second and third embodiments.

The embodiments illustrated above only show examples of applications so as to aid understanding of a principle of the present invention, and many variations within a range not departing from an idea of the present invention are allowed for the embodiments in actual circumstances.

INDUSTRIAL APPLICABILITY

Embodiments of the present invention can be applied to a switched emitter follower circuit.

REFERENCE SIGNS LIST

M1, M4 to M9, M1p, M4p to M9p, M1n, M4n to M9n NPN bipolar transistor

IT, ITp, ITn Constant current source

Chold, Choldp, Choldn Capacitor 10, 10p, 10n, 10n' Gilbert-cell type multiplication circuit 11 Clock distribution circuit.

The invention claimed is:

1. A switched emitter follower circuit, comprising:
a first transistor including a base connected to a signal input terminal, a collector to which a first power voltage is applied, and an emitter connected to a signal output terminal;
a capacitor including a first end connected to the collector of the first transistor and a second end connected to the emitter of the first transistor; and
a Gilbert-cell type multiplication circuit including a positive-phase clock output terminal connected to the emitter of the first transistor and a negative-phase clock output terminal connected to the base of the first transistor, the Gilbert-cell type multiplication circuit being configured to output a multiplication result of a first differential clock signal and a second differential clock signal, the first differential clock signal and the second differential clock signal being input from an outside to the positive-phase clock output terminal and the negative-phase clock output terminal.

2. The switched emitter follower circuit according to claim 1, wherein the Gilbert-cell type multiplication circuit includes:
second transistor including a base into which a positive-phase signal of the first differential clock signal is input and a collector connected to the negative-phase clock output terminal;
a third transistor including a base into which a negative-phase signal of the first differential clock signal is input and a collector connected to the positive-phase clock output terminal;
a fourth transistor including a base into which the negative-phase signal of the first differential clock signal is input and a collector connected to the negative-phase clock output terminal;
a fifth transistor including a base into which the positive-phase signal of the first differential clock signal is input and a collector connected to the positive-phase clock output terminal;
a sixth transistor including a base into which a positive-phase signal of the second differential clock signal is input and a collector connected to an emitter of the second transistor and an emitter of the third transistor;
a seventh transistor including a base into which a negative-phase signal of the second differential clock signal is input and a collector connected to an emitter of the fourth transistor and an emitter of the fifth transistor; and
a constant current source including a first end connected to an emitter of the sixth transistor and an emitter of the seventh transistor, and the constant current source having a second end to which a second power voltage is applied.

3. The switched emitter follower circuit according to claim 1, further comprising:
a clock distribution circuit configured to output branch a differential clock signal input from an outside and to output the first differential clock signal and the second differential clock signal to the Gilbert-cell type multiplication circuit.

4. A switched emitter follower circuit, comprising:
a first transistor including a base connected to a positive-phase signal input terminal, a collector to which a first power voltage is applied, and an emitter connected to a positive-phase signal output terminal;
a second transistor including a base connected to a negative-phase signal input terminal, a collector to which the first power voltage is applied, and an emitter connected to a negative-phase signal output terminal;
a first capacitor including a first end connected to the collector of the first transistor and a second end connected to the emitter of the first transistor;
a second capacitor including a first end connected to the collector of the second transistor and a second end connected to the emitter of the second transistor;
a first Gilbert-cell type multiplication circuit including a first positive-phase clock output terminal connected to the emitter of the first transistor and a first negative-phase clock output terminal connected to the base of the first transistor, the first Gilbert-cell type multiplication circuit being configured to output a multiplication result of a first differential clock signal and a second differential clock signal, the first differential clock signal and the second differential clock signal being input from an outside to the first positive-phase clock output terminal and the first negative-phase clock output terminal; and
a second Gilbert-cell type multiplication circuit including a second positive-phase clock output terminal connected to the emitter of the second transistor and a second negative-phase clock output terminal connected to the base of the second transistor, the second Gilbert-cell type multiplication circuit being configured to output a multiplication result of the first differential clock signal and the second differential clock signal to the second positive-phase clock output terminal and the second negative-phase clock output terminal.

5. The switched emitter follower circuit according to claim 4, wherein the first Gilbert-cell type multiplication circuit includes:
a third transistor including a base into which a positive-phase signal of the first differential clock signal is input and a collector connected to the first negative-phase clock output terminal;
a fourth transistor including a base into which a negative-phase signal of the first differential clock signal is input and a collector connected to the first positive-phase clock output terminal;
a fifth transistor including a base into which the negative-phase signal of the first differential clock signal is input, and a collector connected to the first negative-phase clock output terminal;
a sixth transistor including a base into which the positive-phase signal of the first differential clock signal is input and a collector connected to the first positive-phase clock output terminal;
a seventh transistor including a base into which a positive-phase signal of the second differential clock signal is input and a collector connected to emitters of the third transistor and the fourth transistor;
an eighth transistor including a base into which a negative-phase signal of the second differential clock signal is input, and a collector connected to emitters of the fifth transistor and the sixth transistor; and
a first constant current source including a first end connected to an emitter of the seventh transistor and an emitter of the eighth transistor, and the first constant current source having a second end to which a second power voltage is applied.

6. The switched emitter follower circuit according to claim 5, wherein the second Gilbert-cell type multiplication circuit includes:

a ninth transistor including a base into which the positive-phase signal of the first differential clock signal is input and a collector connected to the second negative-phase clock output terminal;

a tenth transistor including a base into which the negative-phase signal of the first differential clock signal is input and a collector connected to the second positive-phase clock output terminal;

an eleventh transistor including a base into which the negative-phase signal of the first differential clock signal is input and a collector connected to the second negative-phase clock output terminal;

a twelfth transistor including a base into which the positive-phase signal of the first differential clock signal is input and a collector connected to the second positive-phase clock output terminal;

a thirteenth transistor including a base into which the positive-phase signal of the second differential clock signal is input and a collector connected to an emitter of the ninth transistor and an emitter of the tenth transistor;

a fourteenth transistor including a base into which the negative-phase signal of the second differential clock signal is input and a collector connected to an emitter of the eleventh transistor and an emitter of the twelfth transistors; and a second constant current source including a first end connected to an emitter of the thirteenth transistor and an emitter of the fourteenth transistor and a second end to which the second power voltage is applied.

7. The switched emitter follower circuit according to claim 4, wherein the first Gilbert-cell type multiplication circuit includes:

a third transistor including a base into which a positive-phase signal of the first differential clock signal is input and a collector connected to the first negative-phase clock output terminal;

a fourth transistor including a base into which a negative-phase signal of the first differential clock signal is input and a collector connected to the first positive-phase clock output terminal;

a fifth transistor including a base into which the negative-phase signal of the first differential clock signal is input and a collector connected to the first negative-phase clock output terminal;

a sixth transistor including a base into which the positive-phase signal of the first differential clock signal is input and a collector connected to the first positive-phase clock output terminal;

a seventh transistor including a base into which a positive-phase signal of the second differential clock signal is input and a collector connected to an emitter of the third transistor and an emitter of the fourth transistor;

an eighth transistor including a base into which a negative-phase signal of the second differential clock signal is input and a collector connected to an emitter of the fifth transistor and an emitter of the sixth transistor; and a constant current source including a first end connected to an emitter of the seventh transistor and an emitter of the eighth transistor, and the constant current source having a second end to which a second power voltage is applied.

8. The switched emitter follower circuit according to claim 5, wherein the second Gilbert-cell type multiplication circuit includes:

a ninth transistor including a base into which the positive-phase signal of the first differential clock signal is input, a collector connected to the second negative-phase clock output terminal, and an emitter connected to the collector of the seventh transistor;

a tenth transistor including a base into which the negative-phase signal of the first differential clock signal is input, a collector connected to the second positive-phase clock output terminal, and an emitter connected to the collector of the seventh transistor;

an eleventh transistor including a base into which the negative-phase signal of the first differential clock signal is input, a collector connected to the second negative-phase clock output terminal, and an emitter connected to the collector of the eighth transistor; and a twelfth transistor including a base into which the positive-phase signal of the first differential clock signal is input, a collector connected to the second positive-phase clock output terminal, and an emitter connected to the collector of the eighth transistor.

9. The switched emitter follower circuit according to claim 4, further comprising:

a clock distribution circuit configured to output branch a differential clock signal input from an outside and to output the first differential clock signal and the second differential clock signal to the first Gilbert-cell type multiplication circuit.

10. The switched emitter follower circuit according to claim 4, further comprising:

a clock distribution circuit configured to output branch a differential clock signal input from an outside and to output the first differential clock signal and the second differential clock signal to the second Gilbert-cell type multiplication circuit.

11. A switched source/drain follower circuit, comprising:

a first transistor including a gate connected to a signal input terminal, a first source/drain to which a first power voltage is applied, and a second source/drain connected to a signal output terminal;

a capacitor including a first end connected to the first source/drain of the first transistor and a second end connected to the second source/drain of the first transistor; and a Gilbert-cell type multiplication circuit including a positive-phase clock output terminal connected to the second source/drain of the first transistor and a negative-phase clock output terminal connected to the gate of the first transistor, the Gilbert-cell type multiplication circuit being configured to output a multiplication result of a first differential clock signal and a second differential clock signal, the first differential clock signal and the second differential clock signal being input from an outside to the positive-phase clock output terminal and the negative-phase clock output terminal.

12. The switched source/drain follower circuit according to claim 11, wherein the Gilbert-cell type multiplication circuit includes:

second transistor including a gate into which a positive-phase signal of the first differential clock signal is input and a first source/drain connected to the negative-phase clock output terminal;

a third transistor including a gate into which a negative-phase signal of the first differential clock signal is input and a first source/drain connected to the positive-phase clock output terminal;

a fourth transistor including a gate into which the negative-phase signal of the first differential clock signal is input and a first source/drain connected to the negative-phase clock output terminal;

a fifth transistor including a gate into which the positive-phase signal of the first differential clock signal is input and a first source/drain connected to the positive-phase clock output terminal;

a sixth transistor including a gate into which a positive-phase signal of the second differential clock signal is input and a first source/drain connected to a second source/drain of the second transistor and a second source/drain of the third transistor;

a seventh transistor including a gate into which a negative-phase signal of the second differential clock signal is input and a first source/drain connected to a second source/drain of the fourth transistor and a second source/drain of the fifth transistor; and a constant current source including a first end connected to a second source/drain of the sixth transistor and a second source/drain of the seventh transistor, and the constant current source having a second end to which a second power voltage is applied.

13. The switched source/drain follower circuit according to claim 12, further comprising:

a clock distribution circuit configured to output branch a differential clock signal input from an outside and to output the first differential clock signal and the second differential clock signal to the Gilbert-cell type multiplication circuit.

* * * * *